(12) United States Patent
Chen

(10) Patent No.: US 9,373,728 B2
(45) Date of Patent: Jun. 21, 2016

(54) TRENCH MOS PN JUNCTION DIODE STRUCTURE

(71) Applicant: PFC Device Holdings Limited, New Taipei (TW)

(72) Inventor: Mei-Ling Chen, New Taipei (TW)

(73) Assignee: PFC DEVICE HOLDINGS LIMITED, New Taipei (TW)

( * ) Notice: Subject to any disclaimer, the term of this patent is extended or adjusted under 35 U.S.C. 154(b) by 0 days.

(21) Appl. No.: 14/537,280

(22) Filed: Nov. 10, 2014

(65) Prior Publication Data
US 2015/0162454 A1    Jun. 11, 2015

(30) Foreign Application Priority Data
Dec. 11, 2013    (TW) .............................. 102145677 A

(51) Int. Cl.
| H01L 29/861 | (2006.01) |
| H01L 29/06 | (2006.01) |
| H01L 29/66 | (2006.01) |
| H01L 21/265 | (2006.01) |
| H01L 21/3205 | (2006.01) |
| H01L 29/40 | (2006.01) |

(52) U.S. Cl.
CPC ............ *H01L 29/861* (2013.01); *H01L 21/265* (2013.01); *H01L 21/32055* (2013.01); *H01L 29/0619* (2013.01); *H01L 29/407* (2013.01); *H01L 29/66136* (2013.01); *H01L 29/0623* (2013.01)

(58) Field of Classification Search
CPC ................ H01L 29/861; H01L 21/265; H01L 21/32055; H01L 29/0619; H01L 29/407; H01L 29/66136; H01L 29/0623

USPC .......................................................... 257/494
See application file for complete search history.

(56) References Cited

U.S. PATENT DOCUMENTS

| 2005/0196947 | A1 | 9/2005 | Seo et al. | |
| 2009/0114969 | A1* | 5/2009 | Suzuki | ............... H01L 29/0619 |
| | | | | 257/301 |

(Continued)

FOREIGN PATENT DOCUMENTS

| JP | 2013033970 | 2/2013 |
| TW | 201037836 | 10/2010 |
| TW | 201101395 | 1/2011 |

OTHER PUBLICATIONS

Office Action from the Corresponding Taiwanese Application No. 102145677, mailed on Sep. 7, 2015, 6 pages.

*Primary Examiner* — Peter Bradford
(74) *Attorney, Agent, or Firm* — Muncy, Geissler, Olds & Lowe, P.C.

(57) ABSTRACT

A trench MOS PN junction diode structure includes a first conductive type substrate, a plurality of trenches defined on a face of the first conductive type substrate, a gate oxide layer formed at least on inner sidewalls of the trenches, a polysilicon layer formed in the trenches, a second conductive type low-concentration ion-implanted region formed at least in the first conductive type substrate, a high-concentration ion-implanted region formed below the trenches, and an electrode layer covering the first conductive type substrate, the second conductive type low-concentration ion-implanted region, the gate oxide and the polysilicon layer. The high-concentration ion-implanted region below the trenches provides pinch-off voltage sustention in reversed bias operation to reduce leakage current of the trench MOS PN junction diode structure.

12 Claims, 20 Drawing Sheets

(56) References Cited

U.S. PATENT DOCUMENTS

| | | | |
|---|---|---|---|
| 2009/0206913 A1* | 8/2009 | Zeng | H01L 29/0615 327/534 |
| 2010/0102383 A1* | 4/2010 | Izumi | H01L 29/0619 257/330 |
| 2012/0156862 A1 | 6/2012 | Riley et al. | |
| 2012/0299091 A1* | 11/2012 | Tsai | H01L 29/7813 257/334 |
| 2013/0049102 A1* | 2/2013 | Bobde | H01L 29/407 257/330 |
| 2013/0306983 A1* | 11/2013 | Nakano | H01L 29/0623 257/76 |

\* cited by examiner

TRENCH MOS PN JUNCTION DIODE STRUCTURE

FIELD OF THE INVENTION

The present invention relates to a MOS PN junction diode structure, especially to a trench MOS PN junction diode structure.

DESCRIPTION OF PRIOR ART

A Schottky diode is a unipolar device using electrons as carriers, and it is characterized with high switching speed and low forward voltage drop. The limitations of Schottky diodes are the relatively low reverse voltage tolerance and the relatively high reverse leakage current. In contrast to the Schottky diode, a P-N junction diode is a bipolar device that can pass more current than the Schottky diode. However, the P-N junction diode has a forward voltage drop higher than that of the Schottky diode, and takes longer reverse recovery time due to a slow and random recombination of electrons and holes during the recovery period.

Beside Schottky diode based rectifier, the rectifier can also be fabricated by processing the active element such as MOS transistor to form MOS pn junction rectifier diode. US pre-grant publication US 2012/0156862 discloses a method for forming a rectifier device, where trench structure is utilized to form gate oxide layer and to increase device density. However, the rectifier diode thus manufactured has the drawback of high leakage current at reverse bias.

SUMMARY OF THE INVENTION

The object of the present invention is to provide a trench MOS PN junction diode structure to overcome above drawbacks.

Accordingly, the present invention provides a trench MOS PN junction diode structure, comprising: a first conductive type substrate; a plurality of trenches defined on a face of the first conductive type substrate; a gate oxide layer formed at least on inner sidewalls of the trenches; a polysilicon layer formed in the trenches, the gate oxide layer covering at least part of lateral face of the polysilicon layer; a second conductive type low-concentration ion-implanted region formed at least in the first conductive type substrate and outside the gate oxide layer; a second conductive type high-concentration ion-implanted region formed below the trenches, wherein the second conductive type high-concentration ion-implanted region formed has higher dosage concentration than that of the second conductive type low-concentration ion-implanted region; and an electrode layer covering the first conductive type substrate, the second conductive type low-concentration ion-implanted region, the gate oxide and the polysilicon layer.

Moreover, the present invention provides a method for manufacturing a trench MOS PN junction diode structure, comprising: providing a first conductive type substrate; forming a plurality of trenches defined on a face of the first conductive type substrate; forming a second conductive type low-concentration ion-implanted region formed at least in the first conductive type substrate and outside an inner sidewall of the trenches; forming a second conductive type high-concentration ion-implanted region below bottom faces of the trenches; forming a gate oxide layer at least on inner sidewalls of the trenches; and forming an electrode layer covering the first conductive type substrate, the second conductive type low-concentration ion-implanted region, the gate oxide and the polysilicon layer.

BRIEF DESCRIPTION OF DRAWING

The features of the novel invention are set forth with particularity in the appended claims. The invention itself however may be best understood by referring to the following detailed description of the invention. It describes certain exemplary embodiments of the invention, which is taken in conjunction with the accompanying drawings as follows:

DETAILED DESCRIPTION OF THE INVENTION

Figure 1:
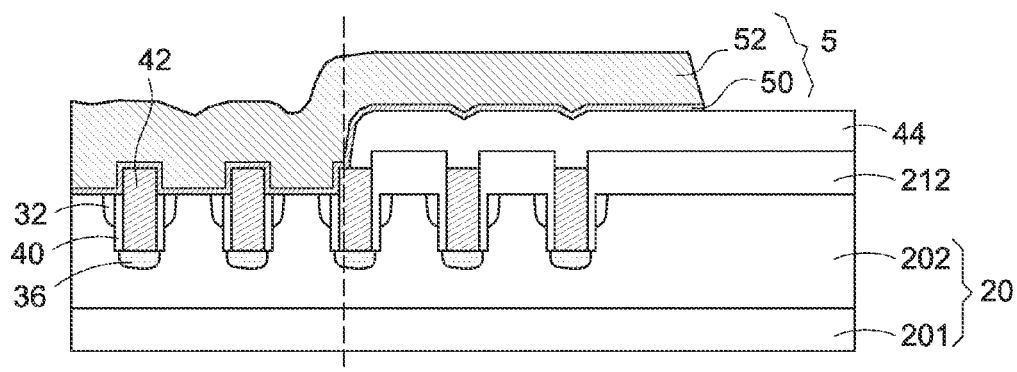
FIG. 1 shows a schematic view of the trench MOS PN junction diode structure according to a first embodiment of the present invention.

FIG. 1 shows a schematic view of the trench MOS PN junction diode structure according to a first embodiment of the present invention. The trench MOS PN junction diode structure includes a semiconductor substrate 20 (which has a heavily-doped N-type silicon layer 201 and a lightly-doped N-type epitaxial layer 202), a plurality of trenches (which can be shown by numeral 30 in FIG. 2C), high-concentration ion-implanted region formed 36 formed on bottom faces of the trenches, sidewall gate oxide layer 40 on inner sidewall of the trenches, low-concentration ion-implanted region 32 formed outside the sidewall gate oxide layer 40, and polysilicon layers 42 formed in the trenches. Moreover, the portion shown on left side of the dashed line is corresponding to device region of the trench MOS PN junction diode structure, the portion shown on right side of the dashed line is corresponding to termination region of the trench MOS PN junction diode structure. Moreover, in the termination region, the lightly-doped N-type epitaxial layer 202 (at the portion without the trenches) has first oxide pattern 212 thereon. In the termination region, a TEOS oxide layer 44 is arranged on the first oxide pattern 212 and the trenches. In the device region, the trench MOS PN junction diode structure further comprises electrode layer 5 (including first metal layer 50 and second metal layer 52) on the lightly-doped N-type epitaxial layer 202 and the polysilicon layers 42, the electrode layer 5 further extends to a portion of the termination region.

Figure 2A:
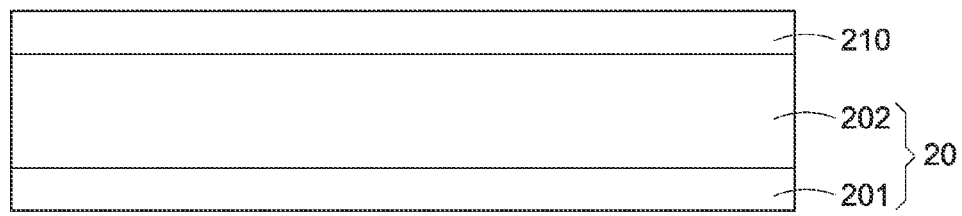
FIGS. 2A~2N show a method of manufacturing a trench MOS PN junction diode structure according to a first embodiment of the present invention.
Figure 2B:
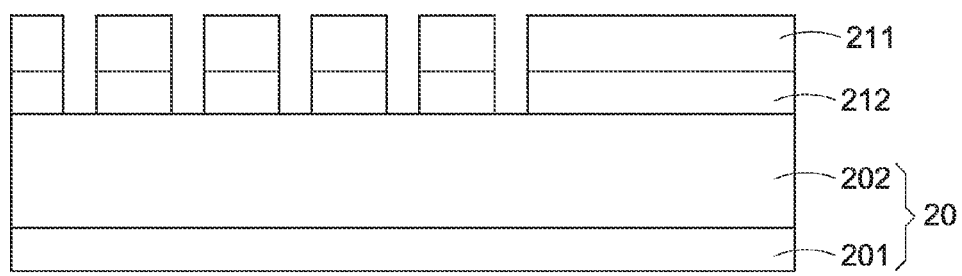
Figure 2C:
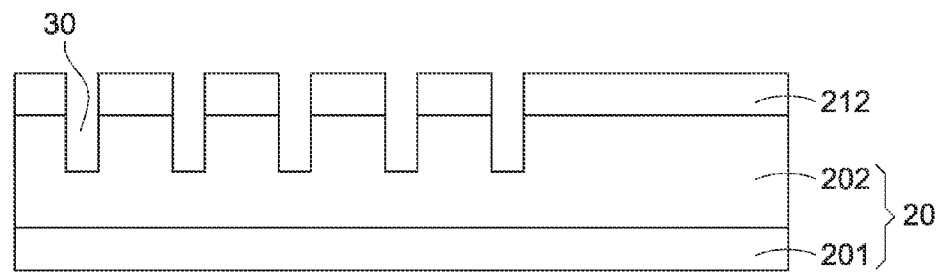
Figure 2D:
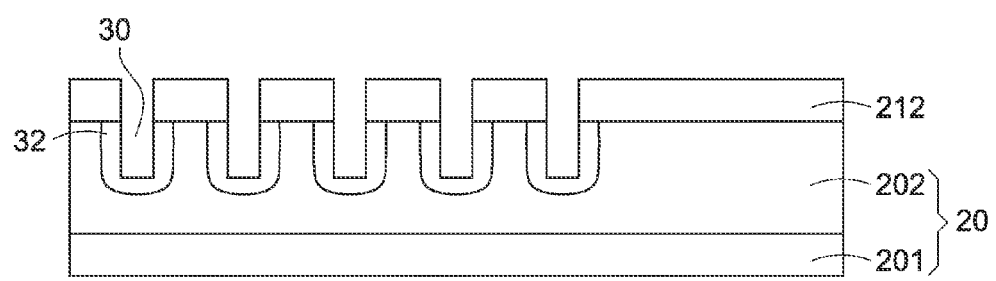
Figure 2E:
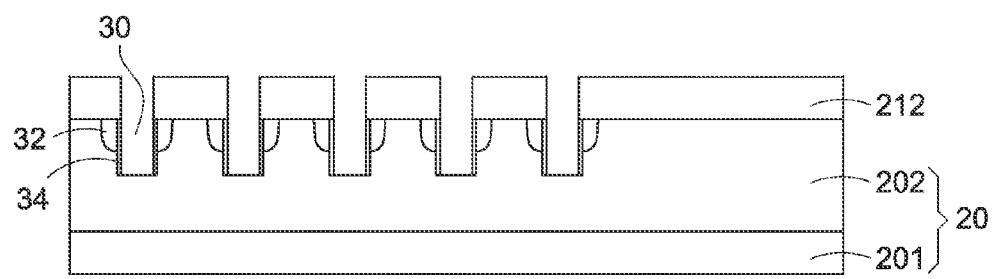
Figure 2F:
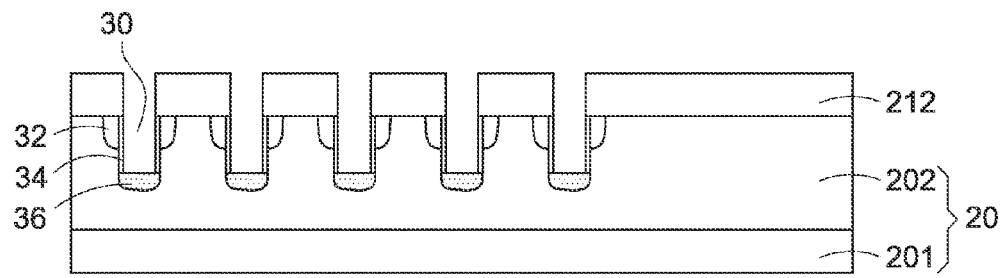
Figure 2G:
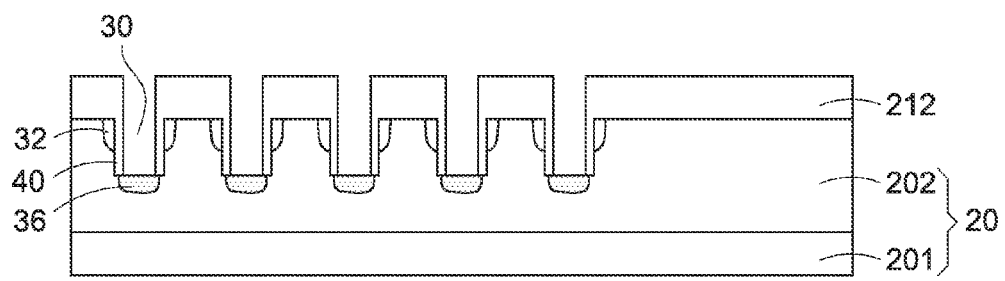
Figure 2H:
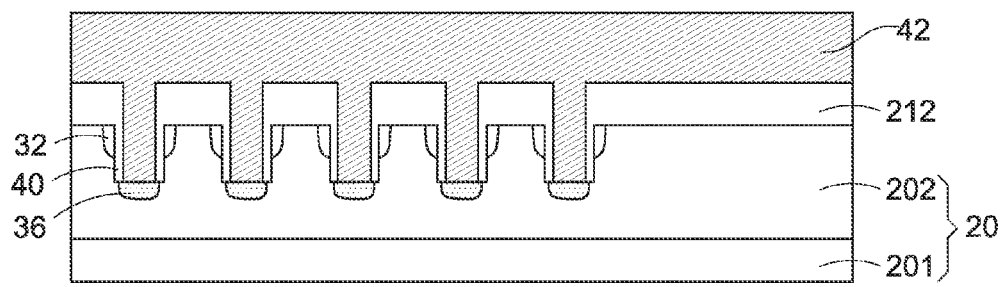
Figure 2I:
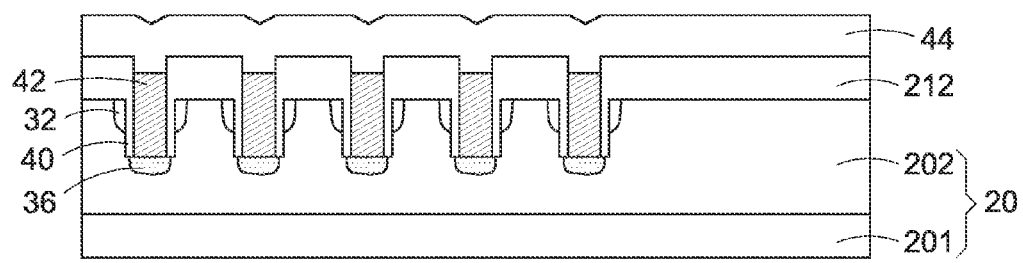
Figure 2J:
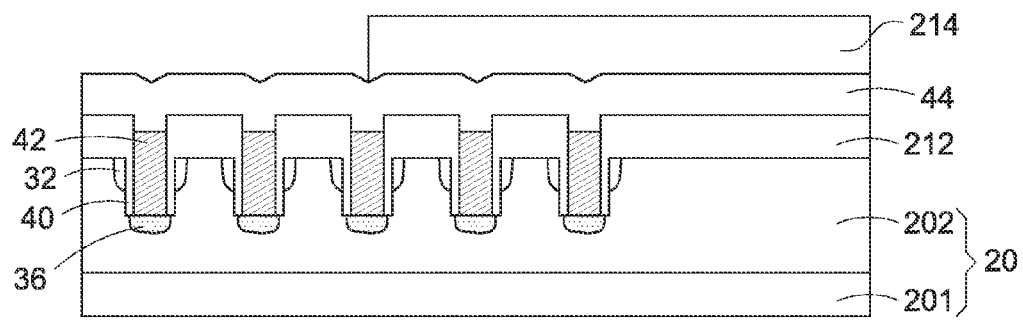
Figure 2K:
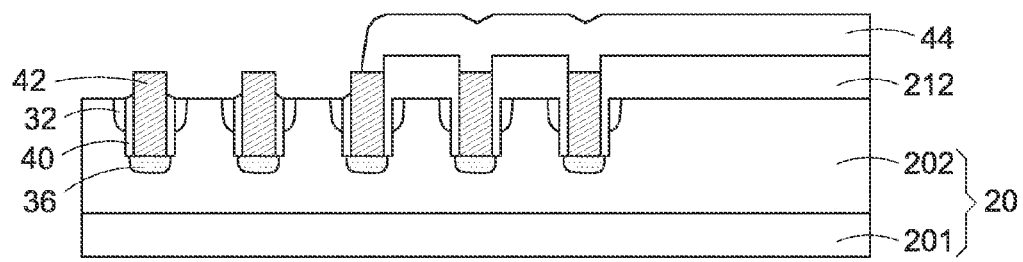
Figure 2L:
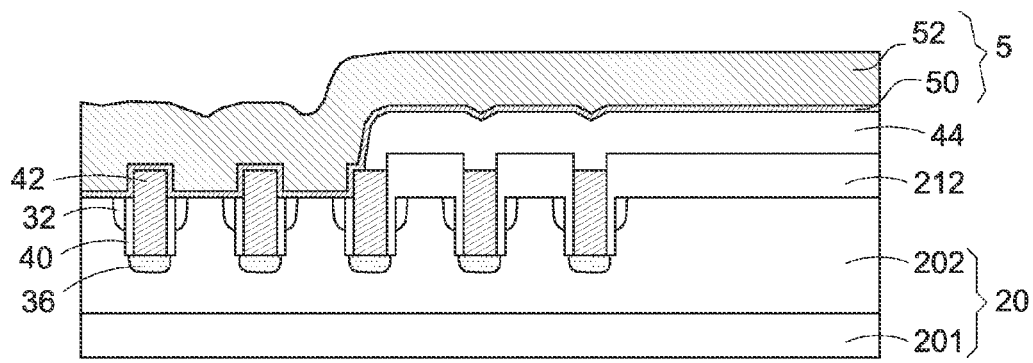
Figure 2M:
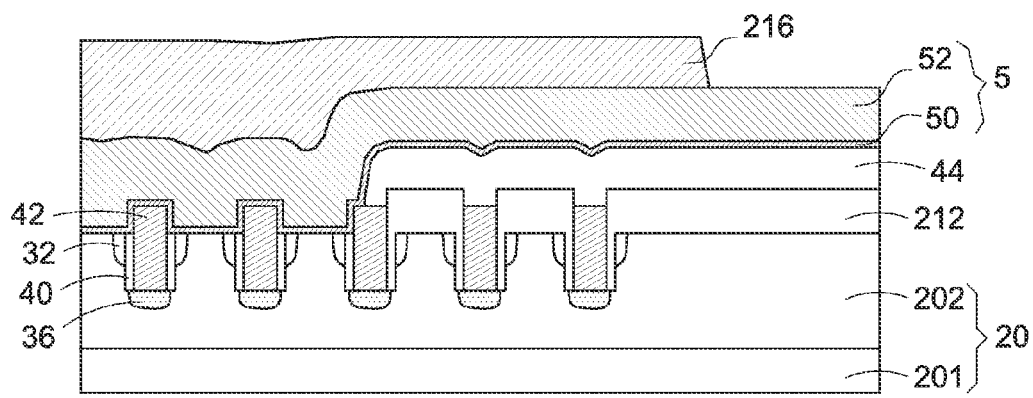
Figure 2N:
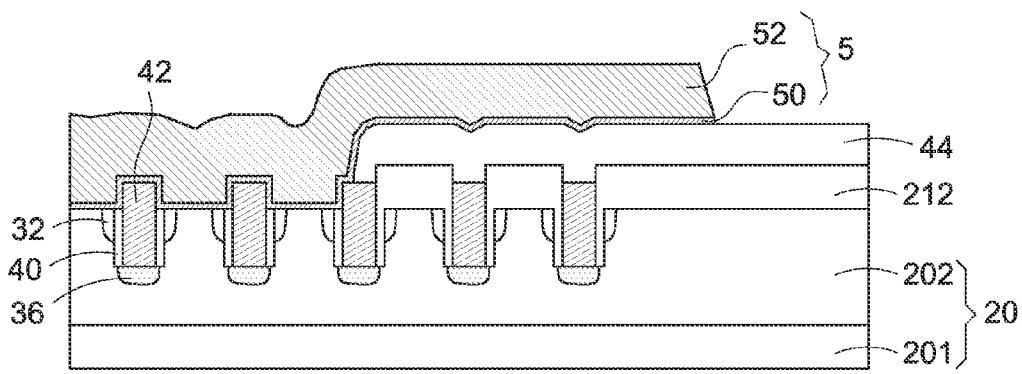

Please refer to FIGS. 2A-2N, which schematically illustrate a method of manufacturing a trench MOS PN junction diode structure according to a first embodiment of the present invention. Firstly, as shown in FIG. 2A, a semiconductor substrate 20 with a heavily-doped N-type silicon layer 201 (N+ silicon layer) and a lightly-doped N-type epitaxial layer 202 (N– epitaxial layer) is provided. Moreover, a first oxide layer 210 is grown on the substrate 20 by, for example, thermal oxidation process.

As shown in FIG. 2B, a first photolithography process is performed on the first oxide layer 210 to form a photoresist layer with photoresist pattern 211, where the portions of the lightly-doped N-type epitaxial layer 202 not covered by the photoresist pattern 211 are corresponding to the regions to be formed with trenches in later process. Moreover, the photoresist pattern 211 is used as mask to etch the first oxide layer 210 into the first oxide pattern 212, which is corresponding to the area not covering the trenches. As shown in FIG. 2C, after removing the photoresist pattern 211, the lightly-doped N-type epitaxial layer 202 is etch (with the exposed first oxide pattern 212 is used as a mask) to form a trench structure having a plurality of trenches 30 on the portion not covered by the first oxide pattern 212. As shown in FIG. 2D, an ion implantation process with low-concentration P type ions (such as boron ions with $10^{12} cm^{-2}$ dosage) is conducted on the trench structure to form low-concentration ion-implanted regions 32 in the lightly-doped N-type epitaxial layer 202. More particularly, the low-concentration ion-implanted regions 32 are formed within the inner sidewalls and below bottom faces of the trenches 30 in the trench structure.

Afterward, as shown in FIG. 2E, an anisotropic etching process is conducted for the trench structure to remove the portion of the low-concentration ion-implanted regions 32 below the bottom faces of the trenches 30. Then an oxidation process is conducted in the trench 30 to form a sacrificial oxide layer 34 on inner sidewalls and bottom faces of the trenches 30 such that the trench structure may have relatively smooth inner sidewalls and bottom faces. Afterward, an ion implantation process with high-concentration P type ions (such as boron ions with $10^{13-16} cm^{-2}$ dosage) is conducted on the trench structure to form high-concentration ion-implanted regions 36 below bottom faces of the trenches in the trenches 30, as shown in FIG. 2F.

Afterward, as shown in FIG. 2G, after removing the sacrificial oxide layer 34, a thermal oxidation process is conducted to form a gate oxide layer on inner walls (including inner sidewall and bottom face) of the trenches 30. The portion of the gate oxide layer on bottom faces of the trenches 30 is then removed such that only gate oxide layer 40 remained on the inner sidewalls of the trenches 30.

As shown in FIG. 2H, a chemical vapor deposition (CVD) process is conducted to form a polysilicon layer 42 on the first oxide pattern 212 and within the trenches 30. The polysilicon layer 42 is in contact with the gate oxide layer 40 on inner sidewalls of the trenches 30 and the high-concentration ion-implanted regions 36 below bottom faces of the trenches 30. After forming the polysilicon layer 42, an ion drive-in process is conducted.

As shown in FIG. 2I, an etch back process is conducted to remove the portion of the polysilicon layer 42, which is on the first oxide pattern 212; and then a low pressure CVD process is conducted to form a TEOS (Tetraethoxysilane) oxide layer 44 on the first oxide pattern 212 and on the polysilicon layer 42 within the trenches 30. As shown in FIG. 2J, a second photolithography process is performed on the resulting structure to form a photoresist layer with photoresist pattern 214, where the photoresist pattern 214 is corresponding to the termination region of the trench MOS PN junction diode structure of the present invention.

Afterward, as shown in FIG. 2K, the TEOS oxide layer 44 and the first oxide pattern 212 are etched with the photoresist pattern 214 as mask to expose, in the device region, the polysilicon layer 42, the gate oxide layer 40 on inner sidewalls of the trenches 30, low-concentration ion-implanted regions 32 within inner sidewalls of the trenches 30, and part of the lightly-doped N-type epitaxial layer 202, which is not covered by the photoresist pattern 214. The photoresist pattern 214 is then removed after the above etching process is completed.

As shown in FIG. 2L, a first metal layer 50 is formed on the exposed polysilicon layer 42, the exposed gate oxide layer 40 on inner sidewalls of the trenches 30, the exposed low-concentration ion-implanted regions 32 within inner sidewalls of the trenches 30, and the exposed lightly-doped N-type epitaxial layer 202. The first metal layer 50 can be made of Ti or TiN. Afterward, a second metal layer 52 is formed on the first metal layer 50, where the second metal layer 52 can be made of aluminum or other metals. Moreover, the first metal layer 50 and the second metal layer 52 together constitute the electrode layer 5.

Afterward, as shown in FIG. 2M, a third photolithography process is performed on the resulting structure to form a photoresist layer with photoresist pattern 216. The first metal layer 50 and the second metal layer 52 are then etched with the photoresist pattern 216 as mask such that portions of the first metal layer 50 and the second metal layer 52 are removed at the edge of the TEOS oxide layer 44. The trench MOS PN junction diode structure according to the first embodiment of the present invention is thus completed and shown in FIG. 2N.

In the trench MOS PN junction diode structure formed by above-mentioned processes, the trenches 30 allows the gate oxide layer 40 to extend along a vertical direction instead of horizontal direction in traditional rectifier diode. Therefore, the gate oxide layer 40 with large surface area can be formed on lightly-doped N-type epitaxial layer 202 and device density can be increased. Moreover, the high-concentration ion-implanted regions 36 below the bottom faces of the trenches 30 can sustain pinch off voltage in reverse bias condition. Therefore, the leakage current of the trench MOS PN junction diode structure operated in reverse bias condition can be reduced.

Figure 3:
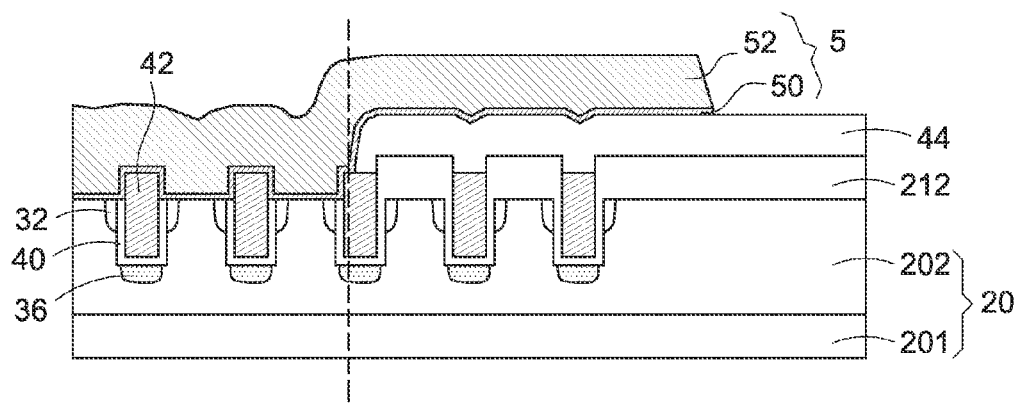
FIG. 3 shows a schematic view of the trench MOS PN junction diode structure according to a second embodiment of the present invention.

FIG. 3 shows a schematic view of the trench MOS PN junction diode structure according to a second embodiment of the present invention. The trench MOS PN junction diode structure includes a semiconductor substrate 20 (which has a heavily-doped N-type silicon layer 201 and a lightly-doped N-type epitaxial layer 202), a plurality of trenches (which can be shown by numeral 30 in FIG. 4C), gate oxide layer 40 on inner sidewalls and bottom faces of the trenches, high-concentration ion-implanted region formed 36 formed below the gate oxide layer 40, low-concentration ion-implanted region 32 formed outside the gate oxide layer 40, and polysilicon layers 42 formed in the trenches. Moreover, the portion shown on left side of the dashed line is corresponding to device region of the trench MOS PN junction diode structure, the portion shown on right side of the dashed line is corresponding to termination region of the trench MOS PN junction diode structure. Moreover, in the termination region, the lightly-doped N-type epitaxial layer 202 (at the portion without the trenches) has first oxide pattern 212 thereon. In the termination region, a TEOS oxide layer 44 is arranged on the first oxide pattern 212 and the trenches. In the device region, the trench MOS PN junction diode structure further comprises electrode layer 5 (including first metal layer 50 and second metal layer 52) on the lightly-doped N-type epitaxial layer 202 and the polysilicon layers 42, the electrode layer 5 further extends to a portion of the termination region.

Figure 4:
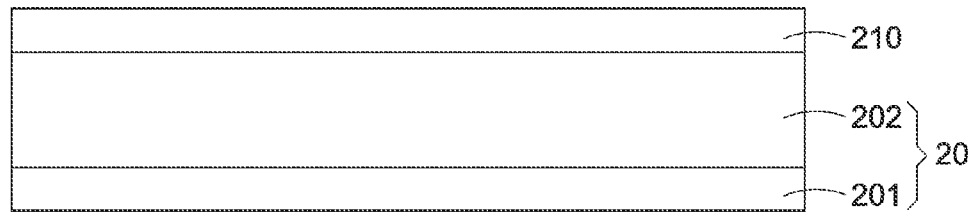
FIGS. 4A~4N show a method of manufacturing a trench MOS PN junction diode structure according to a second embodiment of the present invention.
Figure 4:
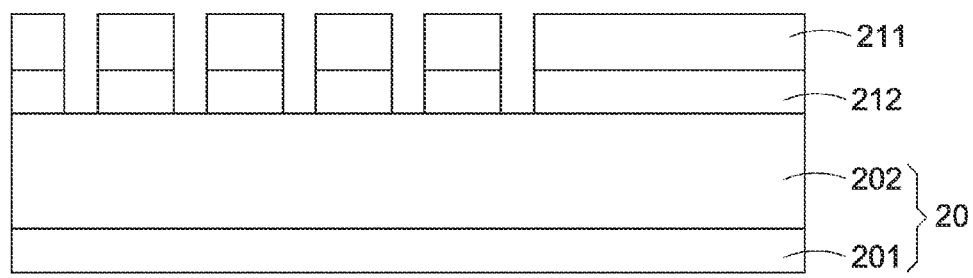
Figure 4:
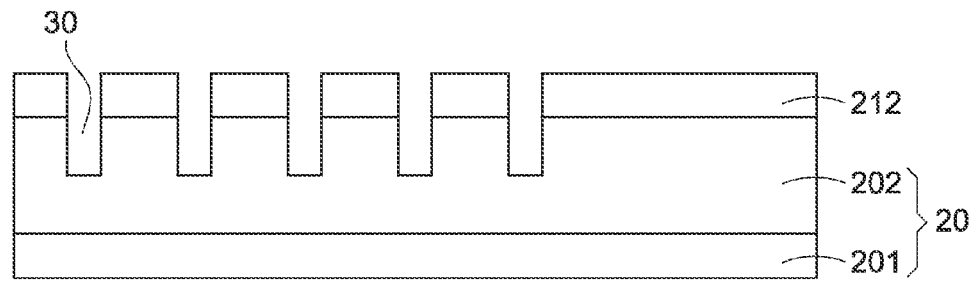
Figure 4:
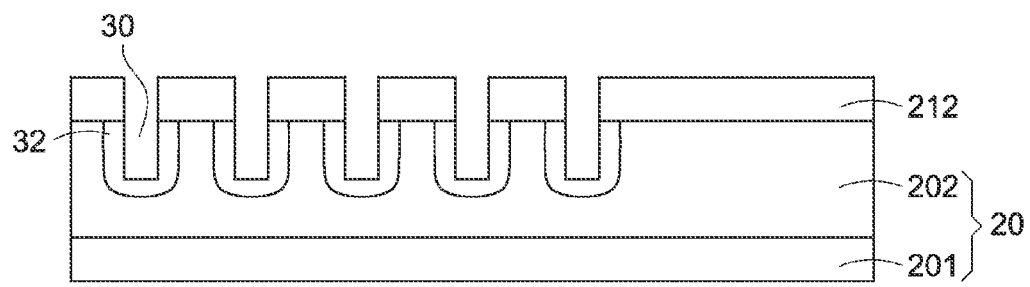
Figure 4:
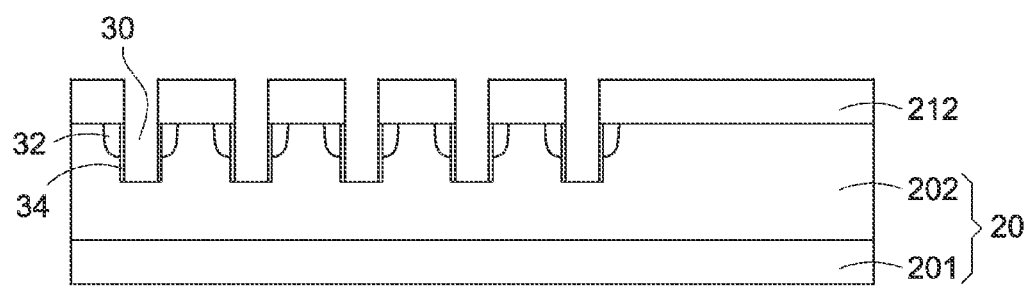
Figure 4:
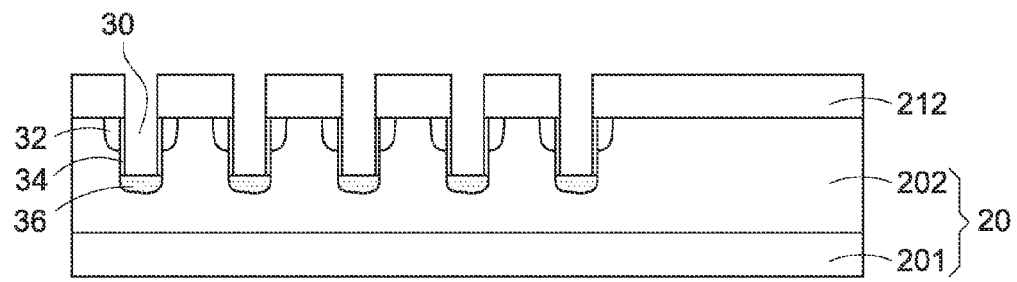
Figure 4:
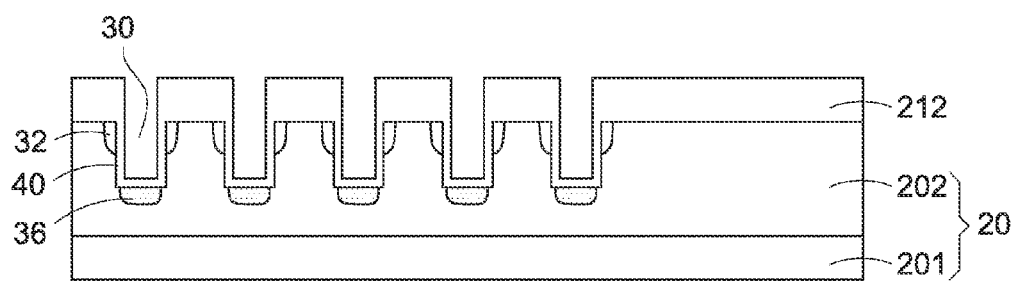
Figure 4:
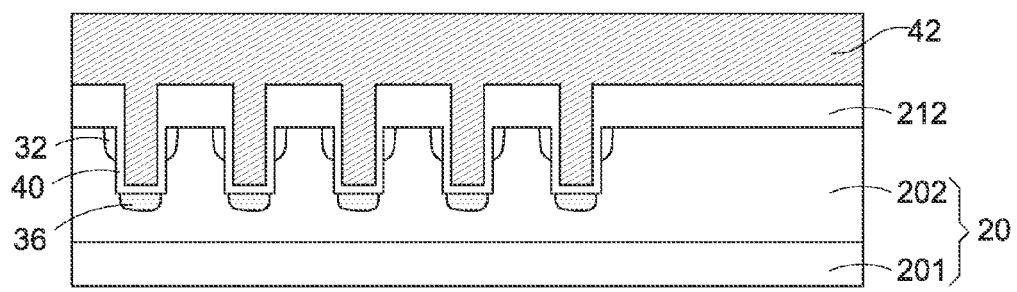
Figure 4:
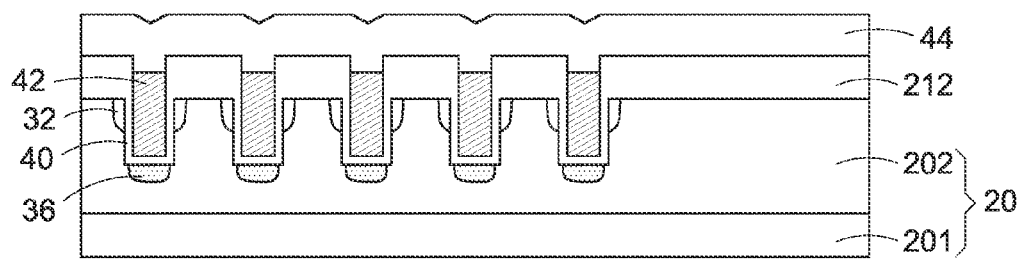
Figure 4:
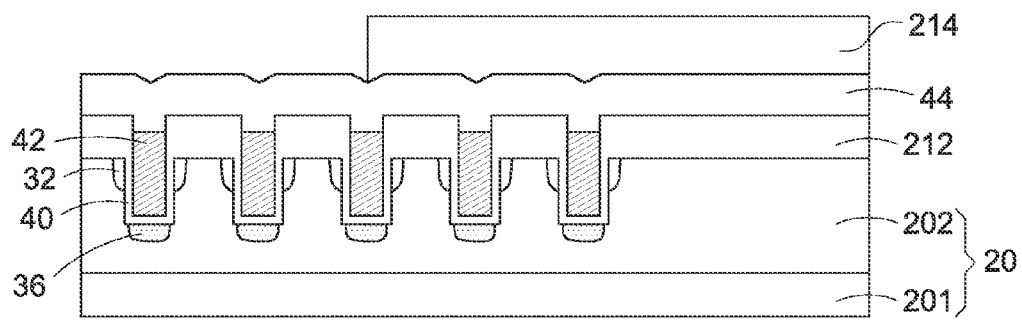
Figure 4:
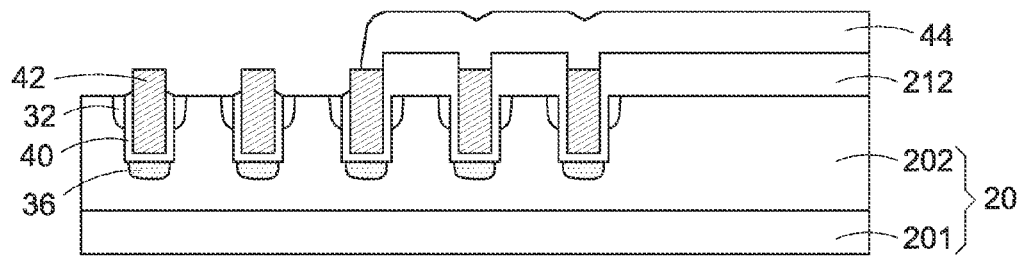
Figure 4:
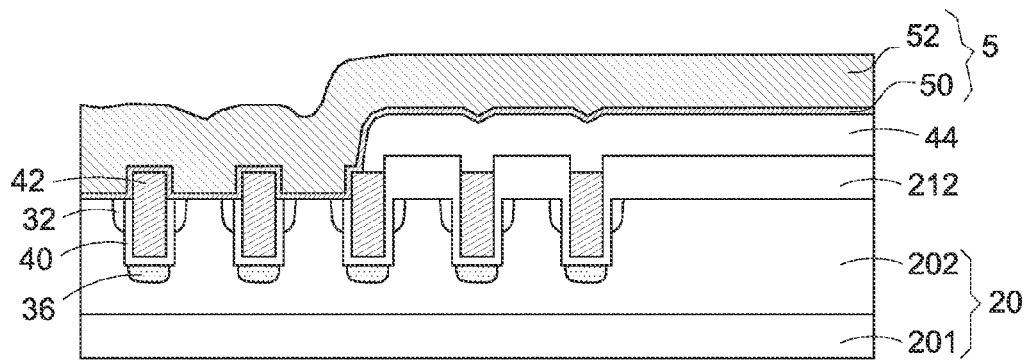
Figure 4:
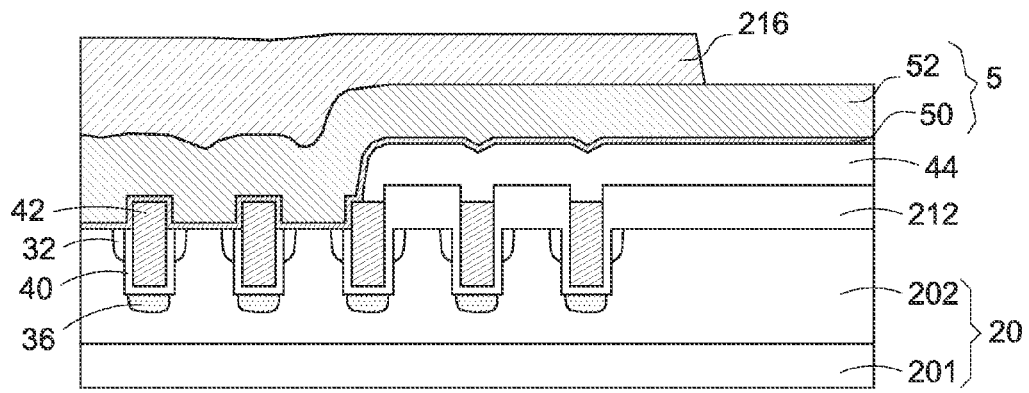
Figure 4:
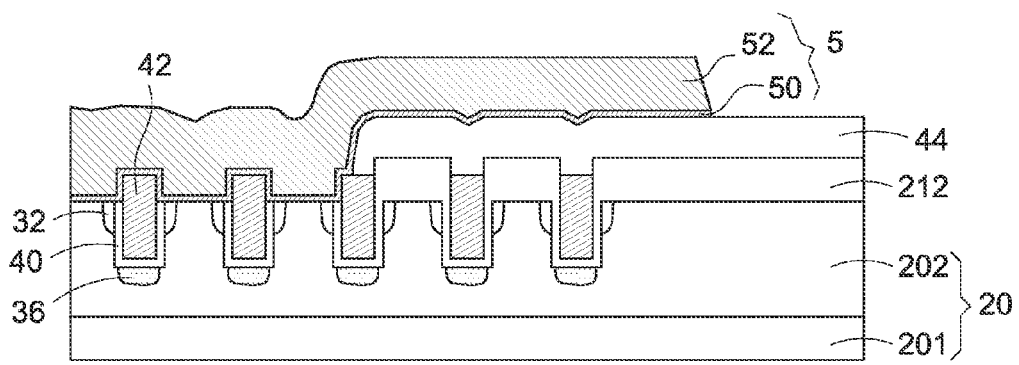

Please refer to FIGS. 4A~4N, which schematically illustrate a method of manufacturing a trench MOS PN junction diode structure according to a second embodiment of the present invention. The processes shown in FIGS. 4A to 4F are the same or similar to those in the first embodiment, and the detailed description is omitted here for brevity.

As shown in FIG. 4G, after removing the sacrificial oxide layer 34, a thermal oxidation process is conducted to form a gate oxide layer on inner walls (including inner sidewalls and bottom faces) of the trenches 30.

As shown in FIG. 4H, a chemical vapor deposition (CVD) process is conducted to form a polysilicon layer 42 on the first oxide pattern 212 and within the trench structure. The polysilicon layer 42 is in contact with the gate oxide layer 40 on inner walls of the trenches 30.

After forming the polysilicon layer 42, an ion drive-in process is conducted.

As shown in FIG. 4I, an etch back process is conducted to remove the portion of the polysilicon layer 42, which is on the first oxide pattern 212; and then a low pressure CVD (LPCVD) process is conducted to form a TEOS (Tetraethoxysilane) oxide layer 44 on the first oxide pattern 212 and on the polysilicon layer 42 within the trench structure. As shown in FIG. 4J, a second photolithography process is performed on the resulting structure to form a photoresist layer with photoresist pattern 214, where the photoresist pattern 214 is corresponding to the termination region of the trench MOS PN junction diode structure of the present invention.

Afterward, as shown in FIG. 4K, the TEOS oxide layer 44 and the first oxide pattern 212 are etched with the photoresist pattern 214 as mask to expose the polysilicon layer 42, the gate oxide layer 40 on inner walls of the trenches 30, low-concentration ion-implanted regions 32 outside the inner sidewalls of the trenches 30, and part of the lightly-doped N-type epitaxial layer 202, which is not covered by the photoresist pattern 214. The photoresist pattern 214 is then removed after the above etching process is completed.

As shown in FIG. 4L, a first metal layer 50 is formed on the exposed polysilicon layer 42, the exposed gate oxide layer 40 on inner walls of the trenches 30, the exposed low-concentration ion-implanted regions 32 on inner sidewalls of the trenches 30, and the exposed lightly-doped N-type epitaxial layer 202. The first metal layer 50 can be made of Ti or TiN. Afterward, a second metal layer 52 is formed on the first metal layer 50, where the second metal layer 52 can be made of aluminum or other metals. Moreover, the first metal layer 50 and the second metal layer 52 together constitute the electrode layer 5.

Afterward, as shown in FIG. 4M, a third photolithography process is performed on the resulting structure to form a photoresist layer with photoresist pattern 216. The first metal layer 50 and the second metal layer 52 are then etched with the photoresist pattern 216 as mask such that portions of the first metal layer 50 and the second metal layer 52 are removed at the edge of the TEOS oxide layer 44. The trench MOS PN junction diode structure according to the second embodiment of the present invention is thus completed and shown in FIG. 4N.

In the trench MOS PN junction diode structure formed by above-mentioned processes, the trench structure allows the gate oxide layer 40 to extend along a vertical direction besides horizontal direction in traditional rectifier diode. Therefore, the gate oxide layer 40 with large surface area can be formed on lightly-doped N-type epitaxial layer 202 and device density can be increased. Moreover, the high-concentration ion-implanted regions 36 below bottom faces of the trenches 30 can sustain pinch off voltage in reverse bias condition. Therefore, the leakage current of the trench MOS PN junction diode structure operated in reverse bias condition can be reduced.

Figure 5:
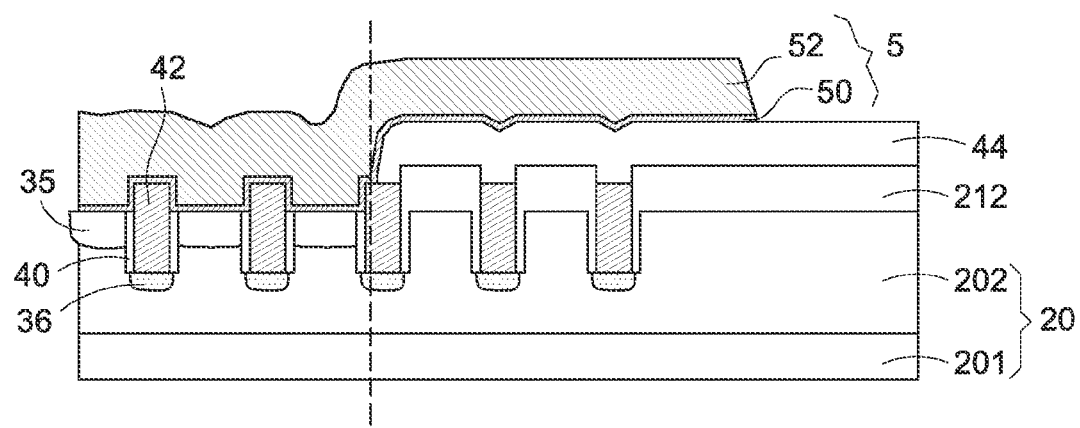
FIG. 5 shows a schematic view of the trench MOS PN junction diode structure according to a third embodiment of the present invention.

FIG. 5 shows a schematic view of the trench MOS PN junction diode structure according to a third embodiment of the present invention. The trench MOS PN junction diode structure includes a semiconductor substrate 20 (which has a heavily-doped N-type silicon layer 201 and a lightly-doped N-type epitaxial layer 202), a plurality of trenches (which can be shown by numeral 30 in FIG. 6C), high-concentration ion-implanted region formed 36 formed below the bottom faces of the trenches, gate oxide layer 40 on inner sidewall of the trenches, low-concentration ion-implanted region 35 formed outside the gate oxide layer 40 and outside the trenches, and polysilicon layers 42 formed in the trenches. Moreover, the portion shown on left side of the dashed line is corresponding to device region of the trench MOS PN junction diode structure, the portion shown on right side of the dashed line is corresponding to termination region of the trench MOS PN junction diode structure. Moreover, in the termination region, the lightly-doped N-type epitaxial layer 202 (at the portion without the trenches) has first oxide pattern 212 thereon. In the termination region, a TEOS oxide layer 44 is arranged on the first oxide pattern 212 and the trenches. In the device region, the trench MOS PN junction diode structure further comprises electrode layer 5 (including first metal layer 50 and second metal layer 52) on the lightly-doped N-type epitaxial layer 202 and the polysilicon layers 42, the electrode layer 5 further extends to a portion of the termination region.

Figure 6:
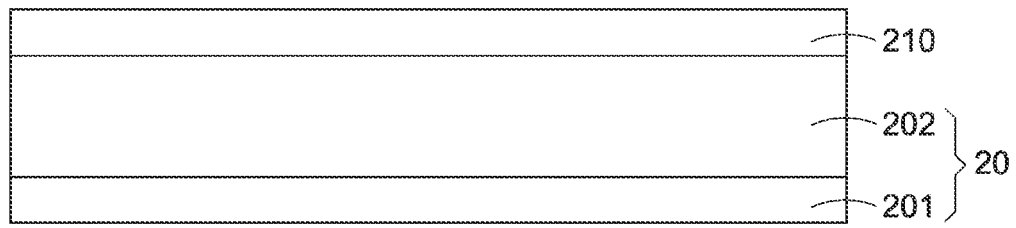
FIGS. 6A~6L show a method of manufacturing a trench MOS PN junction diode structure according to a third embodiment of the present invention.
Figure 6:
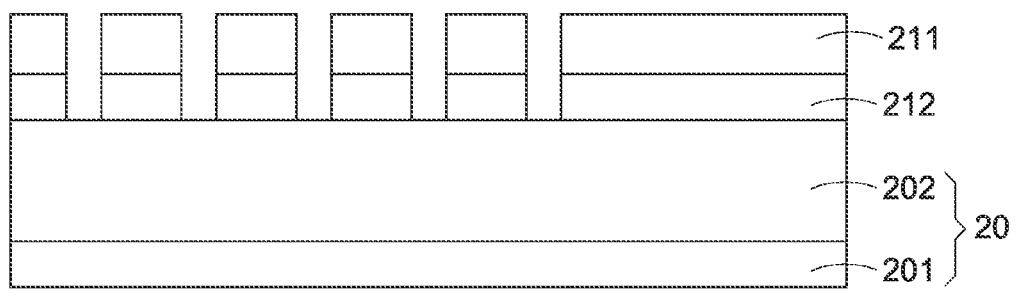
Figure 6:
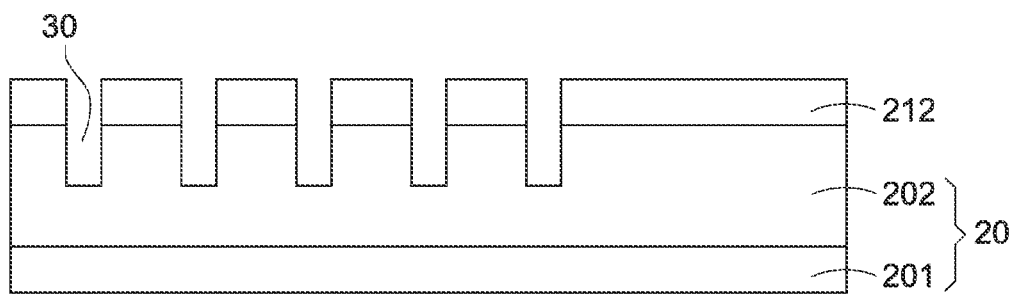
Figure 6:
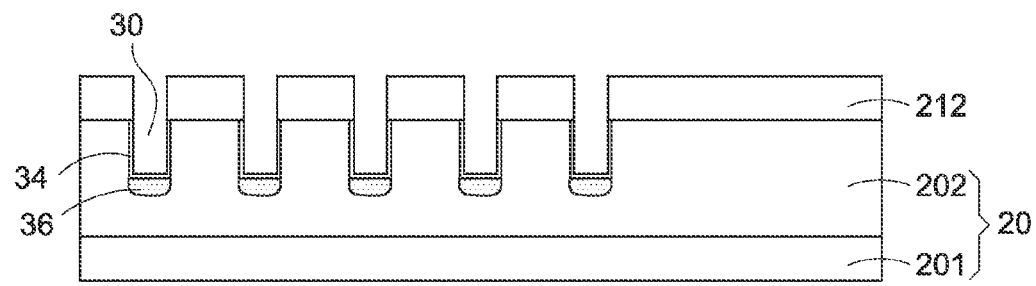
Figure 6:
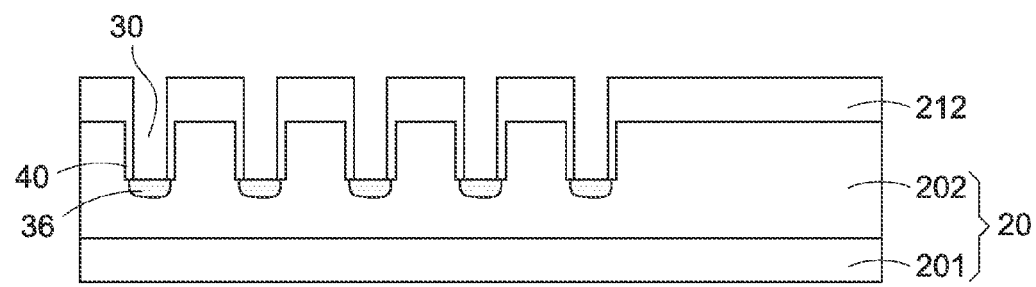
Figure 6:
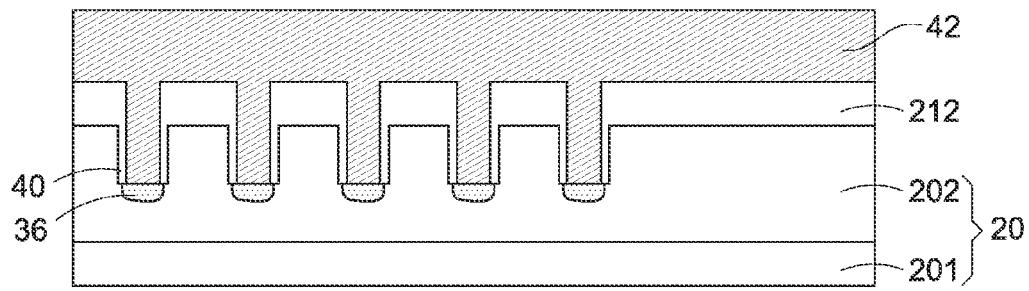
Figure 6:
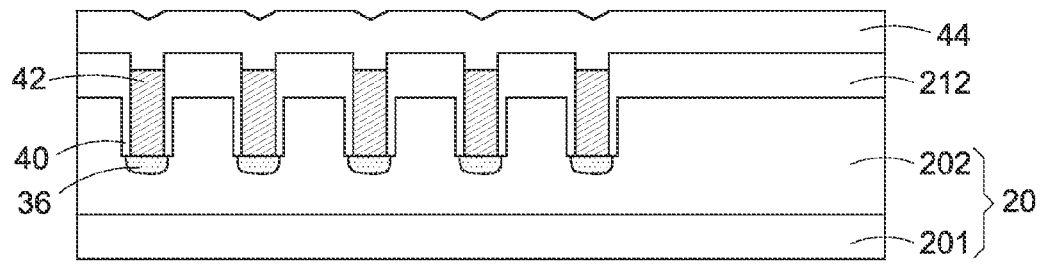
Figure 6:
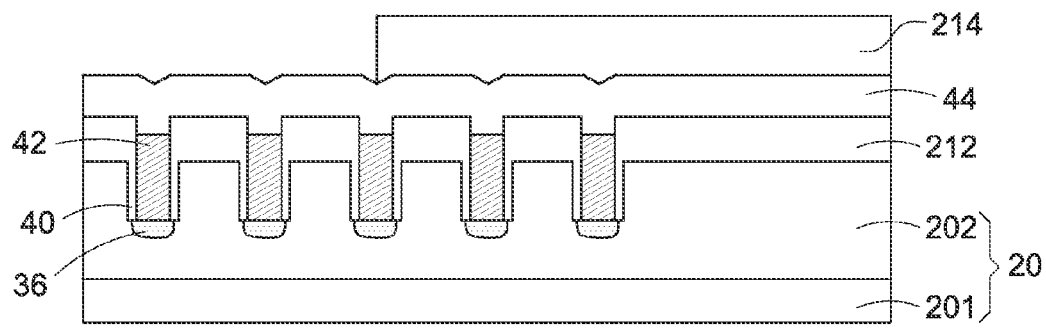
Figure 6:
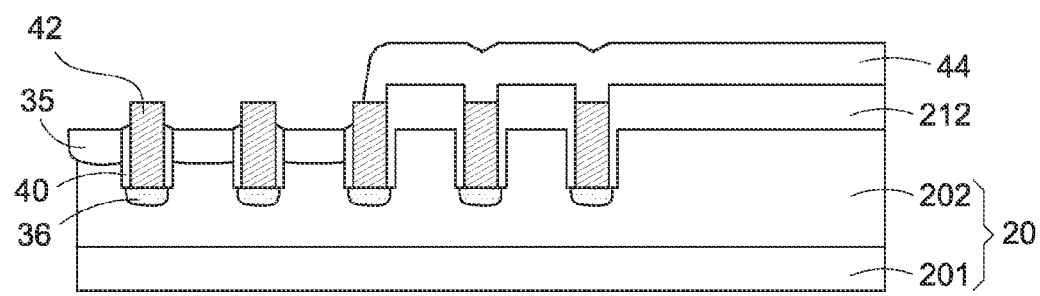
Figure 6:
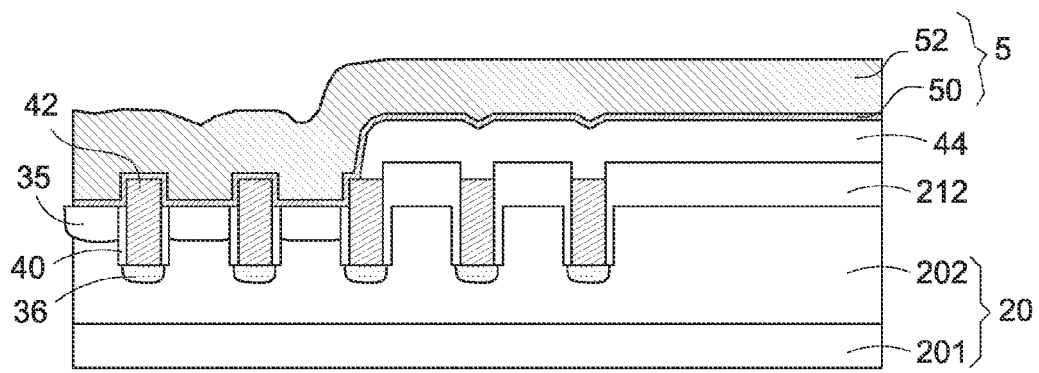
Figure 6:
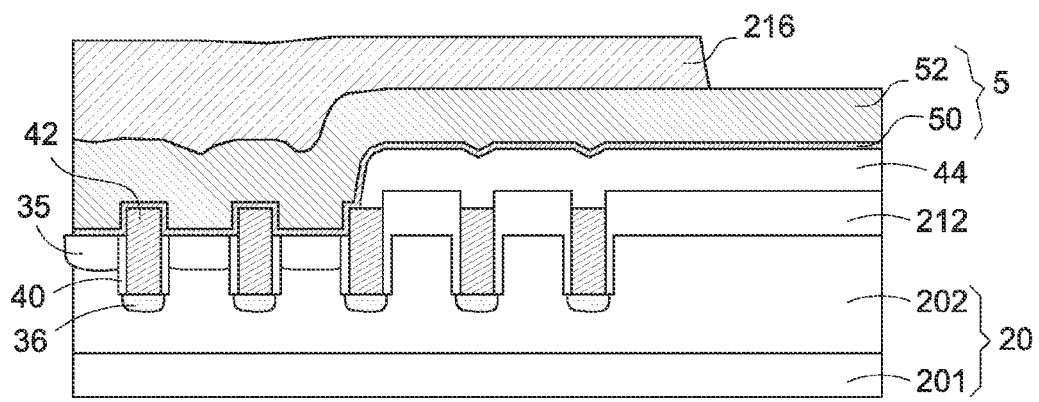
Figure 6:
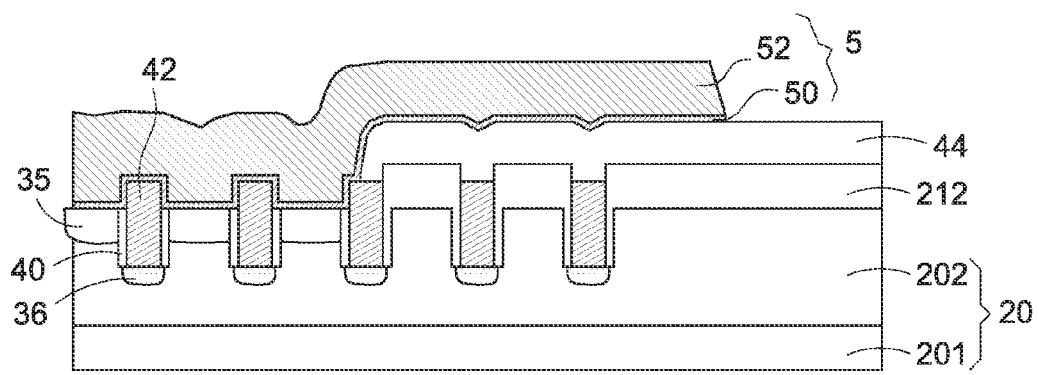

Please refer to FIGS. 6A-6L, which schematically illustrate a method of manufacturing a trench MOS PN junction diode structure according to a third embodiment of the present invention. Firstly, as shown in FIG. 6A, a semiconductor substrate 20 with a heavily-doped N-type silicon layer 201 (N+ silicon layer) and a lightly-doped N-type epitaxial layer 202 (N− epitaxial layer) is provided. Moreover, a first oxide layer 210 is grown on the substrate 20 by, for example, thermal oxidation process.

As shown in FIG. 6B, a first photolithography process is performed on the first oxide layer 210 to form a photoresist layer with photoresist pattern 211, where the portions of the lightly-doped N-type epitaxial layer 202 not covered by the photoresist pattern 211 are corresponding to the regions to be formed with trenches in later process. Moreover, the photoresist pattern 211 is used as mask to etch the first oxide layer 210 into the first oxide pattern 212. As shown in FIG. 6C, after removing the photoresist pattern 211, the lightly-doped N-type epitaxial layer 202 is etch (with the exposed first oxide pattern 212 is used as a mask) to form a trench structure comprising a plurality of trenches 30. As shown in FIG. 6D, an oxidation process is conducted in the trench structure to form a sacrificial oxide layer 34 on inner sidewalls and bottom faces of the trenches 30 such that the trenches 30 may have relatively smooth inner sidewalls and bottom faces. Afterward, an ion implantation process with high-concentration P type ions (such as boron ions with $10^{13-16}$ cm$^{-2}$ dosage) is conducted on the trench structure to form high-concentration ion-implanted regions 36 below bottom faces of the trenches 30, as shown in FIG. 6D.

Afterward, as shown in FIG. 6E, after removing the sacrificial oxide layer 34, a thermal oxidation process is conducted to form a gate oxide layer on inner walls (including inner sidewall and bottom face) of the trenches 30. The portion of the gate oxide layer on bottom faces of the trenches 30 is then removed to from the gate oxide layer 40 on inner sidewalls of the trenches 30.

As shown in FIG. 6F, a chemical vapor deposition (CVD) process is conducted to form a polysilicon layer 42 on the first oxide pattern 212 and within the trench structure. The polysilicon layer 42 is in contact with the gate oxide layer 40 on inner sidewalls of the trenches 30 and the high-concentration ion-implanted regions 36 below the bottom faces of the trenches 30.

As shown in FIG. 6G, an etch back process is conducted to remove the portion of the polysilicon layer 42, which is on the first oxide pattern 212; and then a low pressure CVD process is conducted to form a TEOS (Tetraethoxysilane) oxide layer 44 on the first oxide pattern 212 and on the polysilicon layer 42 within the trench structure. As shown in FIG. 6H, a second photolithography process is performed on the resulting structure to form a photoresist layer with photoresist pattern 214, where the photoresist pattern 214 is corresponding to the termination region of the trench MOS PN junction diode structure of the present invention.

Afterward, as shown in FIG. 6I, the TEOS oxide layer 44 and the first oxide pattern 212 are etched with the photoresist pattern 214 as mask to expose the polysilicon layer 42, the gate oxide layer 40 on the inner sidewalls of the trenches 30, and part of the lightly-doped N-type epitaxial layer 202, which is not covered by the photoresist pattern 214. The photoresist pattern 214 is then removed after the above etching process is completed. Afterward, an ion implantation process with low-concentration P type ions (such as boron ions with $10^{12}$ cm$^{-2}$ dosage) is conducted to form low-concentration ion-implanted regions 35 on upper face of the exposed lightly-doped N-type epitaxial layer 202. More particularly, the low-concentration ion-implanted region 35 shown in this embodiment is different from that shown in FIG. 2E that the low-concentration ion-implanted region 35 in this embodiment covers substantially all exposed upper face of the lightly-doped N-type epitaxial layer 202, which is not covered by the TEOS oxide layer 44.

As shown in FIG. 6J, a first metal layer 50 is formed on the exposed polysilicon layer 42, the exposed gate oxide layer 40 on inner sidewalls of the trenches 30, the exposed low-concentration ion-implanted regions 35, and the exposed lightly-doped N-type epitaxial layer 202. The first metal layer 50 can be made of Ti or TiN. Afterward, a second metal layer 52 is formed on the first metal layer 50, where the second metal layer 52 can be made of aluminum or other metals. Moreover, the first metal layer 50 and the second metal layer 52 together constitute the electrode layer 5.

Afterward, as shown in FIG. 6K, a third photolithography process is performed on the resulting structure to form a photoresist layer with photoresist pattern 216. The first metal layer 50 and the second metal layer 52 are then etched with the photoresist pattern 216 as mask such that portions of the first metal layer 50 and the second metal layer 52 are removed at the edge of the TEOS oxide layer 44. The trench MOS PN junction diode structure according to the first embodiment of the present invention is thus completed and shown in FIG. 6L.

As shown in FIG. 6L, in the trench MOS PN junction diode structure formed by above-mentioned processes, the trench structure allows the gate oxide layer 40 to extend along a vertical direction instead of horizontal direction in traditional rectifier diode. Therefore, the gate oxide layer 40 with large surface area can be formed on lightly-doped N-type epitaxial layer 202 and device density can be increased. Moreover, the high-concentration ion-implanted regions 36 below bottom faces of the trenches 30 can sustain pinch off voltage in reverse bias condition. Therefore, the leakage current of the trench MOS PN junction diode structure operated in reverse bias condition can be reduced.

Figure 7:
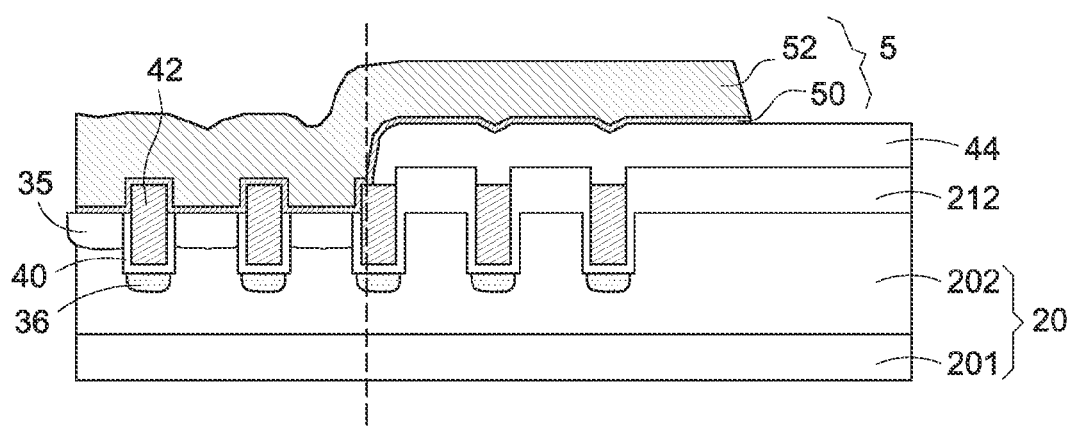
FIG. 7 shows a schematic view of the trench MOS PN junction diode structure according to a fourth embodiment of the present invention.

FIG. 7 shows a schematic view of the trench MOS PN junction diode structure according to the fourth embodiment of the present invention. The trench MOS PN junction diode structure includes a semiconductor substrate 20 (which has a heavily-doped N-type silicon layer 201 and a lightly-doped N-type epitaxial layer 202), a plurality of trenches (which can be shown by numeral 30 in FIG. 8C), gate oxide layer 40 on inner sidewalls and bottom faces of the trenches, high-concentration ion-implanted region formed 36 formed below the gate oxide layer 40, low-concentration ion-implanted region 35 formed outside the gate oxide layer 40 and outside the trenches, and polysilicon layers 42 formed in the trenches. Moreover, the portion shown on left side of the dashed line is corresponding to device region of the trench MOS PN junction diode structure, the portion shown on right side of the dashed line is corresponding to termination region of the trench MOS PN junction diode structure. Moreover, in the termination region, the lightly-doped N-type epitaxial layer 202 (at the portion without the trenches) has first oxide pattern 212 thereon. In the termination region, a TEOS oxide layer 44 is arranged on the first oxide pattern 212 and the trenches. In the device region, the trench MOS PN junction diode structure further comprises electrode layer 5 (including first metal layer 50 and second metal layer 52) on the lightly-doped N-type epitaxial layer 202 and the polysilicon layers 42, the electrode layer 5 further extends to a portion of the termination region.

Please refer to FIGS. 8A~8L, which schematically illustrate a method of manufacturing a trench MOS PN junction diode structure according to a fourth embodiment of the present invention. The processes shown in FIGS. 8A to 8D are the same or similar to those in the third embodiment, and the detailed description is omitted here for brevity.

Figure 8:
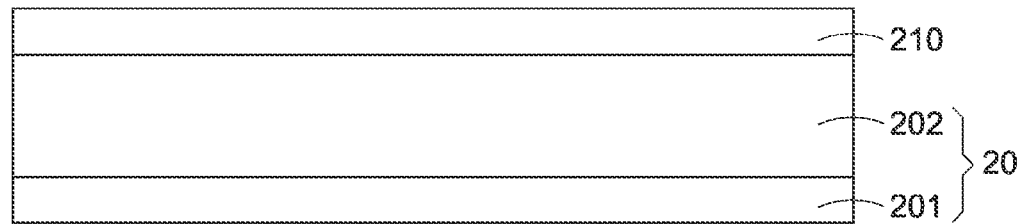
FIGS. 8A~8L show a method of manufacturing a trench MOS PN junction diode structure according to a first embodiment of the present invention.
Figure 8:
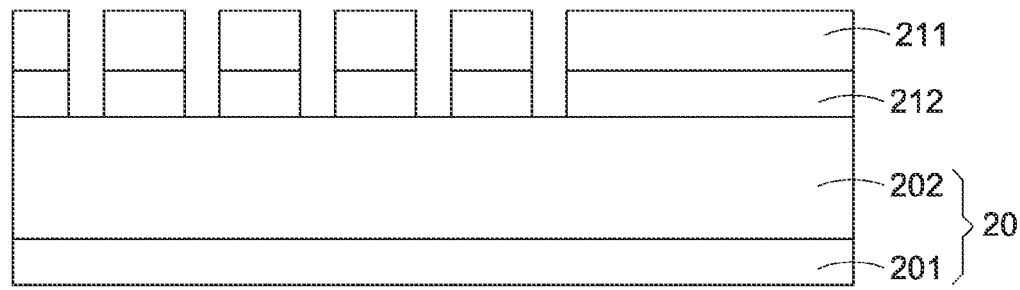
Figure 8:
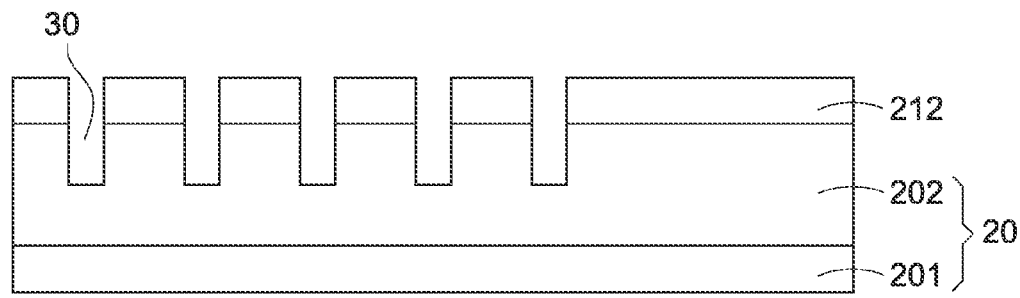
Figure 8:
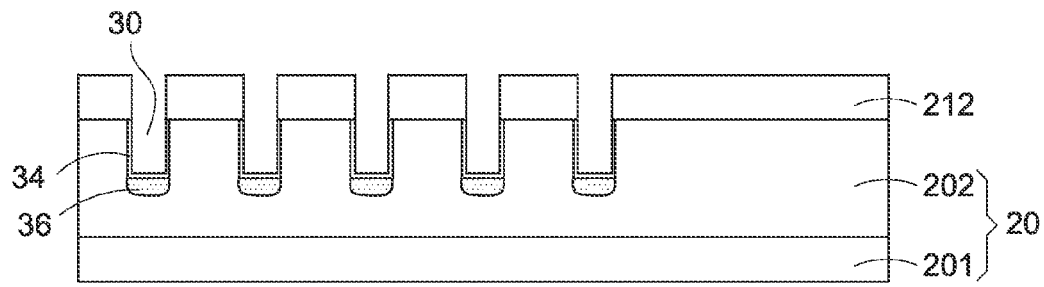
Figure 8:
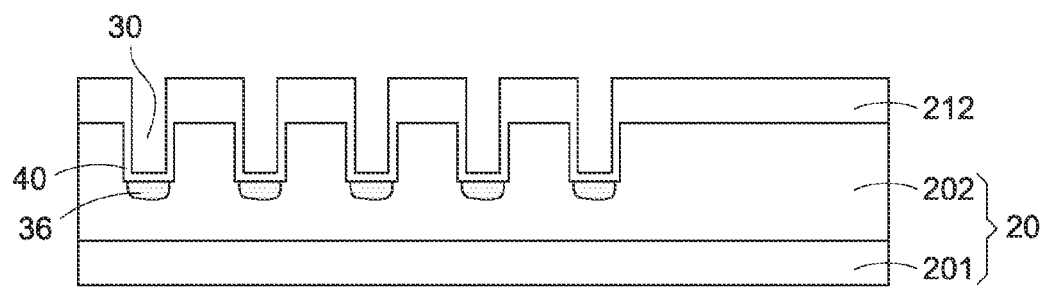
Figure 8:
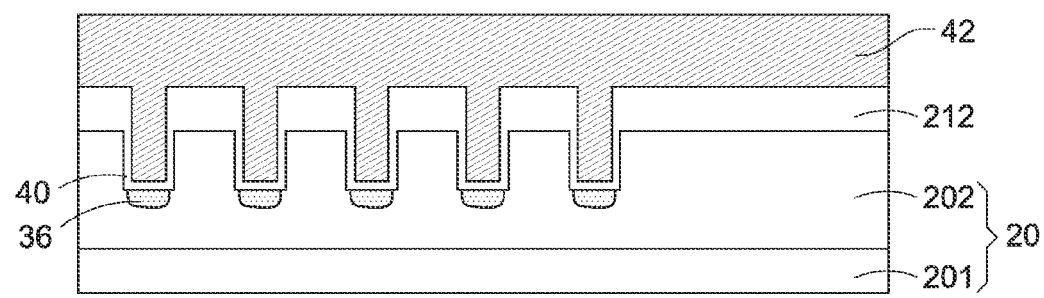
Figure 8:
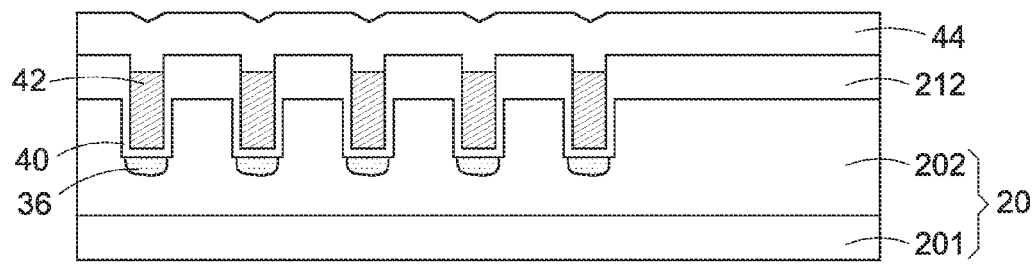
Figure 8:
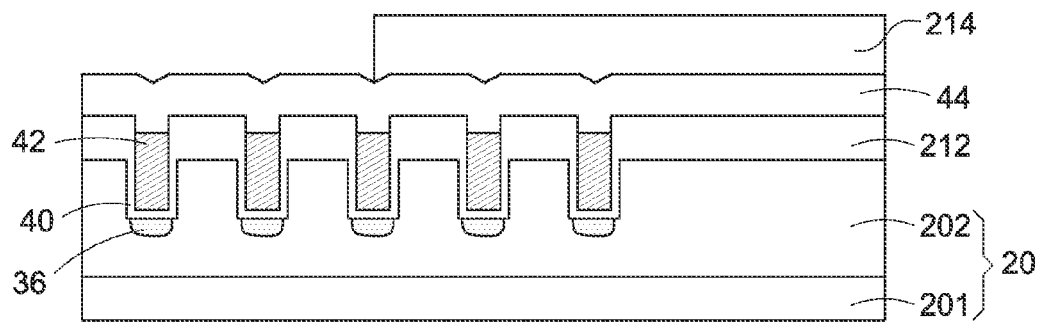
Figure 8:
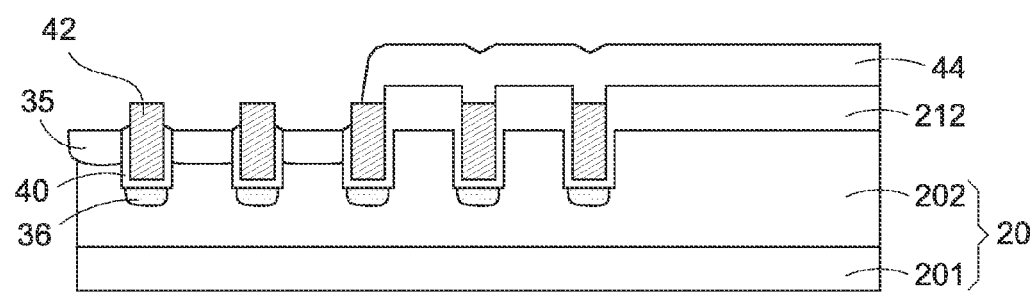
Figure 8:
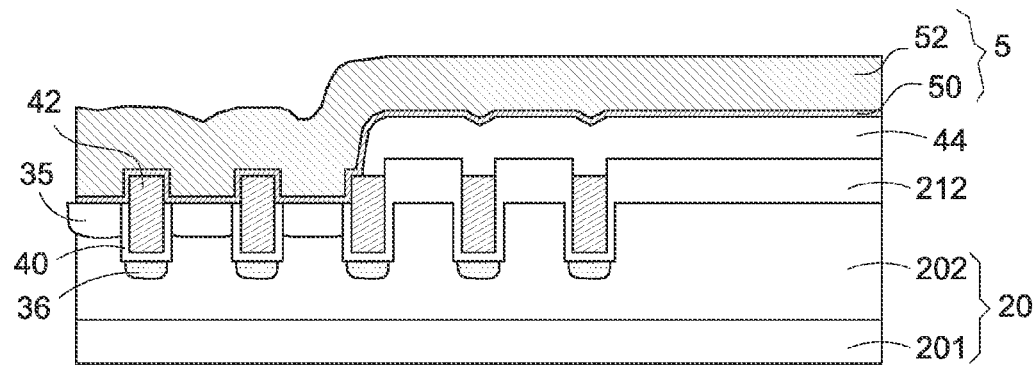
Figure 8:
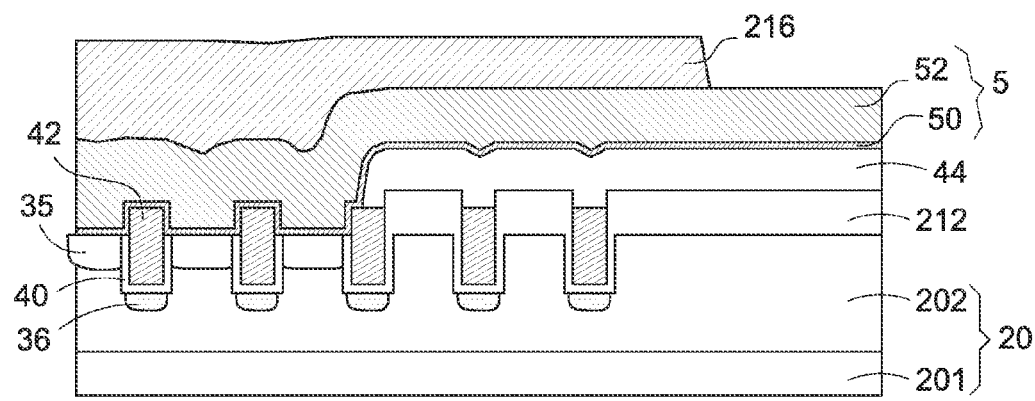
Figure 8:
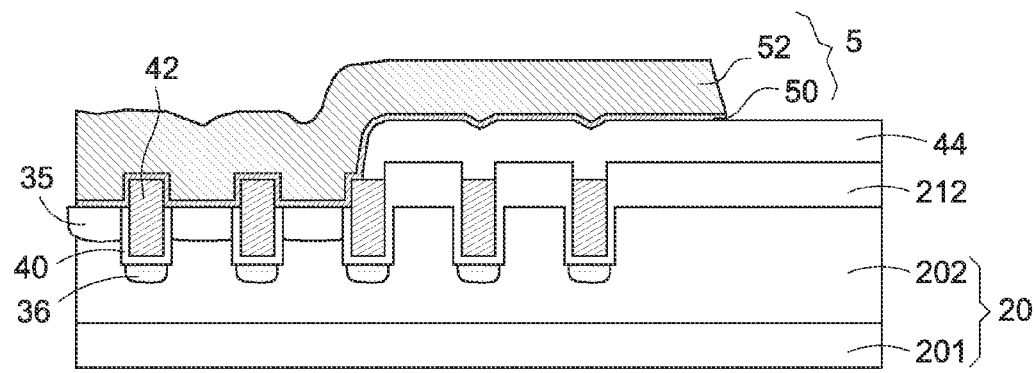

As shown in FIG. 8E, after removing the sacrificial oxide layer 34, a thermal oxidation process is conducted to form a gate oxide layer on inner walls (including inner sidewall and bottom face) of the trenches 30.

As shown in FIG. 8F, a chemical vapor deposition (CVD) process is conducted to form a polysilicon layer 42 on the first oxide pattern 212 and within the trench structure. The polysilicon layer 42 is in contact with the gate oxide layer 40 on inner walls (including inner sidewalls and bottom faces) of the trenches 30.

As shown in FIG. 8G, an etch back process is conducted to remove the portion of the polysilicon layer 42, which is on the first oxide pattern 212; and then a low pressure CVD (LP CVD) process is conducted to form a TEOS (Tetraethoxysilane) oxide layer 44 on the first oxide pattern 212 and on the polysilicon layer 42 within the trench structure. As shown in FIG. 8H, a second photolithography process is performed on the resulting structure to form a photoresist layer with photoresist pattern 214, where the photoresist pattern 214 is corresponding to the termination region of the trench MOS PN junction diode structure of the present invention.

As shown in FIG. 8I, the TEOS oxide layer 44 and the first oxide pattern 212 are etched with the photoresist pattern 214 as mask to expose the polysilicon layer 42, the gate oxide layer 40 on the inner walls of the trenches 30, and part of the lightly-doped N-type epitaxial layer 202, which is not covered by the photoresist pattern 214. The photoresist pattern 214 is then removed after the above etching process is completed. Afterward, an ion implantation process with low-concentration P type ions (such as boron ions with $10^{12}$ cm$^{-2}$ dosage) is conducted to form low-concentration ion-implanted regions 35 on upper face of the exposed lightly-doped N-type epitaxial layer 202. More particularly, the low-concentration ion-implanted region 35 shown in this embodiment is different from that shown in FIG. 4E that the low-concentration ion-implanted region 35 in this embodiment covers substantially all exposed upper face of the lightly-doped N-type epitaxial layer 202, which is not covered by the TEOS oxide layer 44.

As shown in FIG. 8J, a first metal layer 50 is formed on the exposed polysilicon layer 42, the exposed gate oxide layer 40 on inner sidewalls of the trenches 30, the exposed low-concentration ion-implanted regions 35, and the exposed lightly-doped N-type epitaxial layer 202. The first metal layer 50 can be made of Ti or TiN. Afterward, a second metal layer 52 is formed on the first metal layer 50, where the second metal layer 52 can be made of aluminum or other metals. Moreover, the first metal layer 50 and the second metal layer 52 together constitute the electrode layer 5.

Afterward, as shown in FIG. 8K, a third photolithography process is performed on the resulting structure to form a photoresist layer with photoresist pattern 216. The first metal layer 50 and the second metal layer 52 are then etched with the photoresist pattern 216 as mask such that portions of the first metal layer 50 and the second metal layer 52 are removed at the edge of the TEOS oxide layer 44. The trench MOS PN junction diode structure according to the first embodiment of the present invention is thus completed and shown in FIG. 8L.

As shown in FIG. 8L, in the trench MOS PN junction diode structure formed by above-mentioned processes, the trench structure allows the gate oxide layer 40 to extend along a vertical direction beside horizontal direction in traditional rectifier diode. Therefore, the gate oxide layer 40 with large surface area can be formed on lightly-doped N-type epitaxial layer 202 and device density can be increased. Moreover, the high-concentration ion-implanted regions 36 below bottom faces of the trenches 30 can sustain pinch off voltage in reverse bias condition. Therefore, the leakage current of the trench MOS PN junction diode structure operated in reverse bias condition can be reduced.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A trench MOS PN junction diode structure, comprising:
   a first conductive type substrate;
   a plurality of trenches defined on a face of the first conductive type substrate;
   a gate oxide layer formed at least on inner sidewalls of the trenches;
   a polysilicon layer formed in the trenches, the gate oxide layer covering at least part of lateral face of the polysilicon layer;
   a second conductive type low-concentration ion-implanted region formed at least in the first conductive type substrate and outside the gate oxide layer;
   a second conductive type high-concentration ion-implanted region formed below the trenches, wherein the second conductive type high-concentration ion-implanted region formed has higher dosage concentration than that of the second conductive type low-concentration ion-implanted region; and
   an electrode layer covering the first conductive type substrate, the second conductive type low-concentration ion-implanted region, the gate oxide and the polysilicon layer;
   wherein the second conductive type low-concentration ion-implanted region is not connected with the second conductive type high-concentration ion-implanted region;
   wherein the second conductive type low-concentration ion-implanted regions of adjacent trenches are not in contact with each other;
   wherein the second conductive type high-concentration ion-implanted region has dosage of $10^{13}$–$10^{16}$cm$^{-2}$.

2. The trench MOS PN junction diode structure in claim 1, wherein the polysilicon layer is in direct contact with the second conductive type high-concentration ion-implanted region.

3. The trench MOS PN junction diode structure in claim 1, wherein the gate oxide layer is also formed on bottom face of the trenches, and the second conductive type high-concentration ion-implanted region is formed below the gate oxide layer.

4. The trench MOS PN junction diode structure in claim 1, wherein the trench MOS PN junction diode structure has a device region and a termination region, the second conductive type low-concentration ion-implanted region is substantially formed on an exposed surface of the first conductive type substrate in the device region.

5. The trench MOS PN junction diode structure in claim 4, wherein the termination region further comprises:
   a plurality of trenches defined on a face of the first conductive type substrate in the termination region;
   a gate oxide layer formed at least on inner side wails of the trenches in the termination region;
   a polysilicon layer formed in the trenches in the termination region;
   a second conductive type low-concentration ion-implanted region formed at least in the first conductive type substrate in the termination region and outside the gate oxide layer in the termination region;
   a second conductive type high-concentration ion-implanted region formed below the trenches in the termination region, and
   a tetraethoxysilane (TEOS) oxide layer arranged on the first conductive type substrate in the termination region.

6. The trench MOS PN junction diode structure in claim 1, wherein the second conductive type low-concentration ion-implanted region has dosage of $10^{12}$cm$^{-2}$.

7. A method for manufacturing a trench MOS PN junction diode structure, comprising:
   providing a first conductive type substrate;
   forming a plurality of trenches defined on a face of the first conductive type substrate;
   forming a second conductive type low-concentration ion-implanted region formed at least n the first conductive type substrate and outside an inner sidewall of the trenches;
   forming a second conductive type high-concentration ion-implanted region below bottom faces of the trenches;
   forming a gate oxide layer at least on inner sidewalls of the trenches; and
   forming an electrode layer covering the first conductive type substrate, the second conductive type low-concentration ion-implanted region, the gate oxide and the polysilicon layer;

wherein the second conductive type low-concentration ion-implanted region is not connected with the second conductive type high-concentration ion-implanted region;

wherein the second conductive type low-concentration ion-implanted region of adjacent trenches are not in contact with each other;

wherein the second conductive type high-concentration ion-implanted region has dosage of $10^{13}$–$10^{16}$cm$^{-2}$.

8. The method in claim 7, wherein the polysilicon layer is in direct contact with the second conductive type high-concentration ion-implanted region.

9. The method in claim 7, wherein the gate oxide layer is also formed on bottom face of the trenches, and the second conductive type high-concentration ion-implanted region is formed below the gate oxide layer.

10. The method in claim 7, wherein the trench MOS PN junction diode structure has a device region and a termination region, the second conductive type low-concentration ion-implanted region is substantially formed on an exposed surface of the first conductive type substrate in the device region.

11. The method in claim 7, wherein the second conductive type low-concentration ion-implanted region has dosage of $10^{12}$cm$^{-2}$.

12. The method in claim 10, wherein the termination region further comprises:
a plurality of trenches defined on a face of the first conductive type substrate in the termination region;
a gate oxide layer formed at least on inner sidewails of the trenches in the termination region;
a polysilicon layer formed in the trenches in the termination region;
a second conductive type low-concentration ion-implanted region formed at least in the first conductive type substrate in the termination region and outside the gate oxide layer in the termination region;
a second conductive type high-concentration ion-implanted region formed below the trenches in the termination region, and
a tetraethoxysilane (TEOS) oxide layer arranged on the first conductive type substrate in the termination region.

* * * * *